(12) United States Patent
Roberts et al.

(10) Patent No.: US 6,300,285 B1
(45) Date of Patent: Oct. 9, 2001

(54) CRYOGENIC DEFORMATION OF HIGH TEMPERATURE SUPERCONDUCTIVE COMPOSITE STRUCTURES

(75) Inventors: Peter R. Roberts, Groton; William Michels, Brookline, both of MA (US); John F. Bingert, Jemez Springs, NM (US)

(73) Assignee: The Regents of the University of California, Los Alamos, NM (US)

( * ) Notice: Subject to any disclaimer, the term of this patent is extended or adjusted under 35 U.S.C. 154(b) by 937 days.

(21) Appl. No.: 08/814,306

(22) Filed: Mar. 10, 1997

Related U.S. Application Data

(62) Division of application No. 08/508,736, filed on Jul. 28, 1995, now abandoned.
(51) Int. Cl.⁷ .................................................. H01L 39/24
(52) U.S. Cl. ........................ 505/433; 505/430; 505/230; 505/704
(58) Field of Search ...................................... 505/433, 430, 505/230, 704; 29/599; 174/125.1; 427/62

(56) References Cited

PUBLICATIONS

Perin et al, Physica C 216 (1993) pp. 339–344, no month data.*
Sekine et al, J. Appl. Phys. 70(3) Aug. 1991, pp. 1596–1599.*
Heine et al, Appl. Phys. Lett. 55(23), Dec. 1989, pp. 2441–2443.*
Ahn et al, Physica C 235–240 (1994) pp. 3405–3406.*
Haldar et al, Appl. Phys. Lett. 60(4), Jan. 1992, pp. 495–497.*

* cited by examiner

*Primary Examiner*—Shrive P. Beck
(74) *Attorney, Agent, or Firm*—Bruce H. Cottrell

(57) ABSTRACT

An improvement in a process of preparing a composite high temperature oxide superconductive wire is provided and involves conducting at least one cross-sectional reduction step in the processing preparation of the wire at sub-ambient temperatures.

8 Claims, No Drawings

CRYOGENIC DEFORMATION OF HIGH TEMPERATURE SUPERCONDUCTIVE COMPOSITE STRUCTURES

This application is a divisional of application Ser. No. 08/508,736 filed on Jul. 28, 1995, now abandoned.

This invention is the result of a contract with the United States Department of Energy (Contract No. W-7405-ENG-36). The government has certain rights in the invention.

FIELD OF THE INVENTION

The present invention relates to a process for preparing superconductive wire or tape, and more particularly to a process of preparing superconductive wire or tape wherein at least one reduction or deformation stage is conducted at sub-ambient temperatures, e.g., at liquid nitrogen temperatures.

BACKGROUND OF THE INVENTION

The discovery of high temperature superconductive materials in the late 1980's was soon followed by a desire to form such materials into wires, tapes or similar shapes. Ideally such wires or tapes should be physically strong, flexible, highly conductive and able to withstand strong magnetic fields without loss of current carrying capacity.

Processes generally referred to as "powder in a tube" have been developed. For example, a general process of fabricating superconductive wire involves initially preparing a superconductive powder, filling a tube or pipe of silver with the superconductive powder, sealing the pipe or tube, subjecting the pipe or tube to reducing or deforming operations to form wire, and finally sintering the reduced wire.

Generally, conventional deformation processing provides long lengths of a desired form such as rod, wire, tube or tape, consolidates the superconductor powder, and induces a desirable texture into the high temperature superconductive material (referred to as Deformation Induced Texture—DIT). High relative densities and sharp textures in the superconducting phase are required attributes for all high performance high temperature superconductive conductors. Certain high temperature superconductive materials show marked texturing via certain methods of deformation processing. It is well known that high performance high temperature superconductive conductors that contain Bi-2223 are fabricated using an iterative thermomechanical process in which certain types of deformation are interspersed with high temperature heat treatments. The deformation provides the desired density and texture in the high temperature superconductive material and the heat treatments result in chemical reactions that heal microcracks. Ultimately, the result is a composite within which the Bi-2223 grains are textured and connected.

Previous techniques have focused on wire drawing and tape rolling to achieve high density and texture. Such processes have routinely been performed at room or ambient temperatures or at elevated temperatures. Although high performance conductors have been fabricated using a deformational process at room temperature, microstructural analysis of the resultant composites continues to indicate that there is much room for improvement. Accordingly, alternatives to the conventional processing were sought whereby improvement in the properties of the resultant high temperature superconductive composites could be realized.

An object of the present invention is to provide an improved reduction or deformation process for the preparation of high temperature superconductive wires or tapes.

Another object of the present invention is to provide such a reduction or deformation process for the preparation of high temperature superconductive wires or tapes whereby improvements in texture and uniformity of the superconductive material thickness, increased filament uniformity and increased density of the superconductive material can be achieved.

Still another object of the present invention is to provide, via an alternative reduction or deformation process, a high temperature superconductive composite having a higher density of the superconductive material and an improved uniformity of superconductive thickness in the composite as well as improved filament uniformity.

SUMMARY OF THE INVENTION

To achieve the foregoing and other objects, and in accordance with the purposes of the present invention, as embodied and broadly described herein, the present invention provides an improvement in a process of preparing a composite high temperature oxide superconductive wire including filling a metal tube with an oxide superconductive powder material, reducing the cross-sectional dimensions of the tube through a multiple of cross-sectional reduction steps, and sintering the oxide superconductive powder material to produce a resultant composite high temperature oxide superconductive wire, the improvement comprising at least one cross-sectional reduction step being conducted at sub-ambient temperatures.

The present invention further provides the product formed by the process of having at least one cross-sectional reduction step conducted at sub-ambient temperatures, such a superconductive wire including an oxide superconductor core surrounded by a metal sheath, the metal sheath further characterized as having a dislocation density of greater than about $10^{12}/cm^2$, and the oxide superconductor core further characterized as having substantial uniformity in cross sectional dimensions.

DETAILED DESCRIPTION

The present invention concerns a process of preparing a superconductive article, e.g., a superconductive wire or tape, such a process including at least one cross-sectional reduction of the wire or tape at a sub-ambient processing temperature and the resultant product therefrom.

In the process of the present invention, a cross-sectional reduction step is conducted at sub-ambient temperatures. By "sub-ambient"0 is meant that the temperature is intentionally depressed from an otherwise ambient temperature, i.e., room temperature. Preferably, the cross-sectional reduction step is conducted at temperatures of less than about 200 K, more preferably at temperatures of less than about 100 K.

Cross-sectional reduction steps can include drawing, extruding, rolling, pressing, ironing, or swaging, all of which can result in a reduction in the cross sectional dimensions of any particular article after such processing. By conducting at least one cross-sectional reduction step at the sub-ambient temperatures, it has now been found that improved compaction of the superconductive material can be achieved via increased strength of the metal surrounding the superconductive material.

The present superconductive article generally includes a high temperature oxide superconductive material such as a high temperature oxide superconductive ceramic material. By "high temperatures" is generally meant that such a material exhibits superconductivity at temperatures above about 35 K, and preferably exhibits superconductivity at the temperature of liquid nitrogen, about 78 K.

In preparing the superconductive wire or tape including a high temperature oxide superconductive ceramic material, oxide superconductive powder can be prepared from bismuth-based superconductive materials such as a bismuth-strontium-calcium-copper oxide, e.g., $Bi_2Sr_2Ca_2Cu_3O_x$ (Bi-2223) or $Bi_2Sr_2Ca_1Cu_2O_x$, (Bi-2212) or a bismuth-lead-strontium-calcium-copper oxide, e.g., $(Bi_{2-x}Pb_x)Sr_2Ca_2Cu_3O_x$, from rare earth-based superconductive materials including yttrium-based superconductive materials such as a yttrium-barium-copper oxide, e.g., $YBa_2Cu_3O_x$, or from thallium-based superconductive materials such as a thallium-barium-copper oxide, e.g., $Tl_2Ba_2Ca_2Cu_3O_x$.

Numerous other oxide superconductive compositions are well known as exemplified by $MBa_2Cu_3O_x$ where M is neodymium (Nd), dysprosium (Dy), erbium (Er), thulium (Tm), gadolinium (Gd), samarium (Sm), europium (Eu), ytterbium (Yb), holmium (Ho) or mixtures thereof, $La_{2-x}Sn_xCuO_4$, $La_2CuO_4$ doped with fluorine, $YBa_2Cu_3O_x$ doped with fluorine, $EuBa_2(Cu_{1-y}M_y)_3O_x$ where M is chromium (Cr), manganese (Mn), cobalt (Co), nickel (Ni) or zinc (Zn), and $BaKBiO_3$. Those acquainted with the art will appreciate that the list of superconductors, especially high temperature ceramic-type oxide superconductors, is long and continues to grow on a regular basis and that basic high temperature ceramic-type oxide superconductor compositions may generally be doped with various metals, metalloids and non-metals. The purpose of the present invention is to provide an improved process of forming superconductive wire or tape with any of the particular oxide superconductive materials.

The metallic tube or sheath of the wire or tape can generally be of any metal that is chemically compatible and inert with the oxide superconductive material. Generally, silver is the preferred metal for the wires or tape although silver alloys such as an alloy of silver and gold or silver and those elements which provide additional stiffness, such as aluminum, magnesium, hafnium, titanium, holmium and the like by oxide dispersion strengthening (i.e., ODS-Ag alloys), gold and gold alloys as well as a gold- or silver plated metal. Other noble metals such as platinum may also be used as the casing or sheath.

Silver is a face centered cubic (fcc) metal. Nearly all solid materials become brittle at low temperatures, but fcc metals are noted for failing to undergo a ductile-brittle transition. This is a useful property for working at low temperatures.

Experiments on single crystals have shown that plastic deformation on two or more intersecting slip systems is necessary for work hardening. Thus, cubic metals, which employ more than one slip system work harden at a much faster rate than a metal such as zinc, a hexagonal material (hcp) where all dislocations move on planes parallel to the basal plane.

In the work hardening process, secondary dislocations move only short distances before interacting with primary dislocations. Annealed metals typically have dislocation densities of $10^6/cm^2$ to $10^8/cm^2$ depending on the extent of dynamic recovery or recrystallization. Typical values of the dislocation for worked silver are of the order of $10^8/cm^2$ to $5 \times 10^{11}/cm^2$ for deformation performed at 25° C. Dislocation density and material shear strength build up rapidly during work hardening to form dislocation tangles with dislocation densities as high as $5 \times 10^{11}/cm^2$. These tangles spread with increased working until a cell-like structure is formed around the primary slip sources. At low temperatures, primary dislocations are confined to their own slip planes and cannot avoid obstacles that have formed on these planes. Further, suppression of thermally activated defect rearrangement and annihilation leads to higher dislocation densities. This results in rapid work hardening and thus increased stiffness. At very low temperatures such as that of liquid nitrogen (77 K), the dislocation densities obtained within the cubic metal, e.g., silver, are greater than $10^{12}/cm^2$, up to about four times larger than that obtained at ambient temperatures of about 25° C. Processing at the low temperatures also retards the aging processes expected in precipitation hardened sheath materials processed at ambient temperatures. Premature precipitation could limit composite formability. Also, increased densities of the high temperature superconducting cores are achieved through increase in sheath strength as measured by geometric techniques.

The sub-ambient processing of the superconductive articles in the present invention provides greater matrix, i.e., metal sheath, strength that results in improved compaction (i.e., higher density) and thickness uniformity of the inner superconductive material.

The sub-ambient processing also leads to higher strength intermediate precursors in comparison to ambient temperature processing due to the aforementioned higher dislocation density in the sheath. Experimentally, the dislocation density in metals has been shown to be proportional to the square of the flow stress.

The superconductive wire or tape can be a monofilament or a multifilament wire, i.e., the wire or tape can include a multiple of smaller wires or tapes placed into a single larger tube to enhance potential conductivity paths in the final article.

To achieve the sub-ambient temperatures in the wires or tapes during the reduction or deformational processing, the precursor article can be initially cooled by passing through a suitable coolant prior to entry into the deformational stage such as rollers. For example, the precursor article can be passed through a bath of liquid nitrogen immediately prior to entering a roll bite. Optionally, or in conjunction, rollers could be chilled to cool the article as it is being deformed. Lubrication of the article may also be incorporated, and this may provide improvided insulation thereby keeping the temperature of the article during deformation lower than if processed without lubrication.

The present invention is more particularly described in the following example which is intended as illustrative only, since numerous modifications and variations will be apparent to those skilled in the art.

EXAMPLE 1

A multifilamentary superconductive tape was prepared by placing a multiple of fine silver tubes containing Bi-2223 powder into a larger silver tube or sheath. Samples of this precursor article of about 2 millimeters (2 mm) in thickness were then subjected to deformation processing to reduce the cross sectional diameter to about 150 microns with some pieces processed at room temperature and some processed after passing through a bath of liquid nitrogen. This primary rolling involved about 40 passes through the rollers at the particular processing temperature. Those pieces rolled at sub-ambient temperatures were maintained within a liquid nitrogen bath in between individual passes through the rollers to inhibit softening processes within the silver sheath such as recrystallization.

After rolling the pieces were subsequently sintered by heating above 750° C. in accordance with the multistep process described in U.S. patent application Ser. No. 08/041,822, filed Apr. 1, 1993 by Riley et al. such process incorporated herein by reference. The general powder in a tube (PIT) process is described, for example, in U.S. Pat. Nos. 4,826,808 and 5,189,009 to Yurek et al. and W. Gao et al., Superconducting Science and Technology, Vol. 5, pp. 318–326, 1992, which teach the use of a metal alloy precursor having the same metal content as the desired superconducting oxide, and in Rosner et al., "Status of HTS superconductors: Progress in improving transport critcial current densities in HTS Bi-2223 tapes and coils" (presented at conference 'Critical Currents in High Tc Superconductors', Vienna, Austria, April 1992) and K. Sandage, G. N. Riley Jr., and W. L. Carter, "Critical Issues in the OPIT Processing of High Jc BSSCO Superconductors", Journal of Metals, 43, 21, 19, which teach the use of either a mixture of powders of the oxide components of the superconductor or of a powder having the nominal composition of the superconductor, all of which are herein incorporated by reference.

Measurements of the pieces processed with primary rolling at room temperature were compared with those pieces processed with primary rolling at sub-ambient temperatures. The dimensions of the cores were more uniform in the tapes rolled at sub-ambient temperatures. The achieved Engineering Current Density, Je, expresses in Amperes per square centimeter (A/cm$^2$), measured using a 1 microvolt per centimeter ($\mu$V/cm) criterion @ 77 K, self field, averaged 3011 A/cm$^2$ for pieces processed at room temperature, while those processed at sub-ambient temperatures had an average performance of 3335 A/cm$^2$. Processing at sub-ambient temperatures yielded about a 10% improvement in Je values in A/cm$^2$, the improvement being statistically significant at the 99% level.

The cryogenic processing gave enhanced high temperature superconductor core uniformity due likely to the higher dislocation density and/or improved microstructural stablity of the sheath from the decrease of thermally activated motion. For a pure silver sheath, sub-ambient processing resulted in about a 35% improvement in core uniformity as measured from the longitudinal sections of thirty-two pairs of composites each ranked for uniformity on a scale of 1 through 5.

Although the present invention has been described with reference to specific details, it is not intended that such details should be regarded as limitations upon the scope of the invention, except as and to the extent that they are included in the accompanying claims.

What is claimed is:

1. In a process of preparing a composite high temperature oxide superconductive wire including filling a metal tube with an oxide superconductive powder material, reducing the cross-sectional dimensions of the tube through a multiple of cross-sectional reduction steps, and sintering the oxide superconductive powder material to produce a resultant composite high temperature oxide superconductive wire, the improvement comprising at least one cross-sectional reduction step being conducted at sub-ambient temperatures.

2. The process of claim 1 wherein said at least one cross-sectional reduction step is conducted at temperatures of less than about 100 K.

3. The process of claim 1 wherein all cross-sectional reduction steps are conducted at sub-ambient temperatures.

4. The process of claim 3 wherein said at least one cross-sectional reduction step is conducted at temperatures of less than about 100 K.

5. The process of claim 3 wherein all said cross-sectional reduction steps are conducted at temperatures of less than about 100 K.

6. The process of claim 1 wherein said metal tube is selected from the group consisting of silver, gold, silver-alloys and gold-alloys.

7. The process of claim 1 wherein said oxide superconductive powder material is Bi-2223.

8. The process of claim 1 wherein said oxide superconductive powder material is Bi-2212.

* * * * *